United States Patent
Zhang

(10) Patent No.: US 8,859,346 B2
(45) Date of Patent: Oct. 14, 2014

(54) METHOD FOR MANUFACTURING ARRAY SUBSTRATE WITH EMBEDDED PHOTOVOLTAIC CELL

(75) Inventor: Xindi Zhang, Guandong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 115 days.

(21) Appl. No.: 13/635,403

(22) PCT Filed: Jul. 27, 2012

(86) PCT No.: PCT/CN2012/079245
§ 371 (c)(1),
(2), (4) Date: Sep. 15, 2012

(87) PCT Pub. No.: WO2014/012269
PCT Pub. Date: Jan. 23, 2014

(65) Prior Publication Data
US 2014/0024151 A1   Jan. 23, 2014

(51) Int. Cl.
*H01L 21/00* (2006.01)

(52) U.S. Cl.
USPC ............ 438/149; 438/164; 438/166; 257/70; 257/75; 257/291; 257/E29.125; 257/E27.125

(58) Field of Classification Search
USPC ............ 438/149, 164, 166; 257/70, 75, 291, 257/439, 443, E29.117, E29.151, E29.152, 257/E27.125, E27.122
See application file for complete search history.

(56) References Cited

U.S. PATENT DOCUMENTS

| | | |
|---|---|---|
| 2002/0008796 A1 | 1/2002 | Kung |
| 2007/0102035 A1 | 5/2007 | Yang |
| 2008/0073656 A1* | 3/2008 | Peng et al. ................ 257/79 |
| 2009/0201042 A1* | 8/2009 | Sellathamby et al. ....... 324/763 |
| 2011/0254008 A1* | 10/2011 | Suzawa et al. ............... 257/59 |

FOREIGN PATENT DOCUMENTS

| | | |
|---|---|---|
| CN | 101127362 A | 2/2008 |
| CN | 101614896 A | 12/2009 |
| CN | 102253547 A | 11/2011 |
| JP | 2008164851 A | 7/2008 |

* cited by examiner

*Primary Examiner* — Su Kim
(74) *Attorney, Agent, or Firm* — Andrew C. Cheng

(57) ABSTRACT

A method for manufacturing array substrate with embedded photovoltaic cell includes: providing a substrate; forming a buffer layer on the substrate; forming an amorphous silicon layer on the buffer layer; converting the amorphous silicon layer into a polysilicon layer; forming a pattern on the polysilicon layer; forming a first photoresist pattern on the polysilicon layer and injecting $N^+$ ions; forming a gate insulation layer on the polysilicon layer; forming a second photoresist pattern on the gate insulation layer and injecting $N^-$ ions; forming a third photoresist pattern on the gate insulation layer and injecting $P^+$ ions; forming a metal layer on the gate insulation layer so as to form a gate terminal; forming a hydrogenated insulation layer on the metal layer; forming a first ditch in the first insulation layer; and forming a second metal layer on the first insulation layer.

10 Claims, 7 Drawing Sheets

METHOD FOR MANUFACTURING ARRAY SUBSTRATE WITH EMBEDDED PHOTOVOLTAIC CELL

BACKGROUND OF THE INVENTION

1. Field of the Invention

The present invention relates to the field of liquid crystal displaying, and in particular to a method for manufacturing array substrate with embedded photovoltaic cell.

2. The Related Arts

Liquid crystal display (LCD) has a variety of advantages, such as thin device body, low power consumption, and being free of radiation, and is thus widely used. Most of the LCDs that are currently available in the market are backlighting LCDs, which comprise a liquid crystal display panel and a backlight module. The operation principle of the liquid crystal display panel is that liquid crystal molecules are interposed between two parallel glass substrates and the liquid crystal molecules are controlled to change direction by application of electricity to the glass substrates in order to refract light emitting from the backlight module for generating images. Since the liquid crystal display panel itself does not emit light, light must be provided by the backlight module in order to normally display images. Thus, the backlight module is one of the key components of an LCD. The backlight module can be classified in two types, namely side-edge backlight module and direct backlight module, according to the position where light gets incident. The direct backlight module arranges a light source, such as a cold cathode fluorescent lamp (CCFL) or a light-emitting diode (LED), at the back side of the liquid crystal display panel to form a planar light source that directly provides lighting to the liquid crystal display panel. The side-edge backlight module arranges a backlight source of LED light bar at an edge of a back panel to be located rearward of one side of the liquid crystal display panel. The LED light bar emits light that enters a light guide plate (LGP) through a light incident face of the light guide plate and is projected out through a light emergence face of the light guide plate, after being reflected and diffused, to thereby transmit through an optic film assembly and form a planar light source for the liquid crystal display panel. However, there is only about 6% of the light emitting from the backlight source that can transmit through the liquid crystal display panel. This cause a waste of a large amount of light energy.

A liquid crystal display panel is generally composed of a color filter (CF) substrate, a thin film transistor (TFT) substrate, and liquid crystal (LC) and sealant interposed between the CF substrate and the TFT substrate. A general manufacturing process comprises a front stage of array process (including thin film, yellow light, etching, and film stripping), an intermediate stage of cell process (including bonding TFT substrate and CF substrate), and a rear stage of assembling process (including mounting drive ICs and printed circuit board). The front stage of array process generally makes the TFT substrate for controlling the movement of liquid crystal molecules. The intermediate stage of cell process generally introduces the liquid crystal between the TFT substrate and the CF substrate. The rear stage of assembling process generally mounts the drive ICs and combining the printed circuit board to effect driving the liquid crystal molecules to rotate for displaying images.

A photovoltaic cell is a device that directly converts photo energy into electrical energy through photoelectrical effect or photochemical effect. To improve the utilization of light from the backlight module of a liquid crystal display device, those skilled in the art include photovoltaic cells in the liquid crystal display panel. The photovoltaic cells absorb excessive photo energy and convert the photo energy into electrical energy to power components or accessories of the liquid crystal display panel. Photo energy emitting from the backlight source can thus be fully used and the consumption of external power sources can be reduced.

However, the current manufacturing techniques only work to integrate already-manufactured photovoltaic cells with the liquid crystal display panel. The manufacturing process is complicated and the manufacture cycle is long, so that the manufacture cost is increased.

SUMMARY OF THE INVENTION

An object of the present invention is to provide a method for manufacturing an array substrate with embedded photovoltaic cell, which allows the photovoltaic cell to be formed at the same time with the formation of the array substrate, making the manufacturing process simple and cost low.

To achieve the object, the present invention provides a method for manufacturing an array substrate with embedded photovoltaic cell, which comprises the following steps:

Step 1: providing a substrate;

Step 2: forming a buffer layer on the substrate;

Step 3: forming an amorphous silicon layer on the buffer layer;

Step 4: carrying out laser annealing to convert the amorphous silicon layer into a polysilicon layer;

Step 5: applying a masking operation to form a predetermined pattern on the polysilicon layer;

Step 6: forming a first photoresist pattern on the polysilicon layer and injecting $N^+$ ions into the first photoresist pattern;

Step 7: forming a gate insulation layer on the polysilicon layer;

Step 8: forming a second photoresist pattern on the gate insulation layer and injecting $N^-$ ions into the second photoresist pattern;

Step 9: forming a third photoresist pattern on the gate insulation layer and injecting and activating $P^+$ ions into the third photoresist pattern;

Step 10: forming a first metal layer on the gate insulation layer and applying a masking operation to form a gate terminal;

Step 11: forming a first insulation layer on the first metal layer and hydrogenating the first insulation layer to form a hydrogenated insulation layer;

Step 12: applying a masking operation to form a first ditch in the first insulation layer; and Step 13: forming a second metal layer on the first insulation layer and applying a masking operation to form metal electrodes so as to complete a thin-film transistor and a photovoltaic cell.

The method further comprises the following steps:

Step 14: forming a second insulation layer on the second metal layer and applying a masking operation to the second insulation layer to form a second ditch;

Step 15: forming a planarization layer on the second insulation layer and applying a masking operation to form a third ditch;

Step 16: forming a transparent electrode on the planarization layer and applying a masking operation to the transparent electrode to form a predetermined pattern; and Step 17: carrying out an annealing operation on the transparent electrode.

The substrate comprises a glass substrate.

The buffer layer, the amorphous silicon layer, and the first and second insulation layers are formed on the substrate through chemical vapor deposition.

The first and second metal layers are formed through sputtering operations.

The masking operation comprises exposure operation, development operation, and etching operation.

The $N^+$ ions, the $N^-$ ions, and the $P^+$ ions are located in the polysilicon layer.

The transparent electrode layer comprises an indium tin oxide layer.

The planarization layer comprises an organic layer.

The present invention also provides a method for manufacturing array substrate with embedded photovoltaic cell, which comprises the following steps:

Step 1: providing a substrate;

Step 2: forming a buffer layer on the substrate;

Step 3: forming an amorphous silicon layer on the buffer layer;

Step 4: carrying out laser annealing to convert the amorphous silicon layer into a polysilicon layer;

Step 5: applying a masking operation to form a predetermined pattern on the polysilicon layer;

Step 6: forming a first photoresist pattern on the polysilicon layer and injecting $N^+$ ions into the first photoresist pattern;

Step 7: forming a gate insulation layer on the polysilicon layer;

Step 8: forming a second photoresist pattern on the gate insulation layer and injecting $N^-$ ions into the second photoresist pattern;

Step 9: forming a third photoresist pattern on the gate insulation layer and injecting and activating $P^+$ ions into the third photoresist pattern;

Step 10: forming a first metal layer on the gate insulation layer and applying a masking operation to form a gate terminal;

Step 11: forming a first insulation layer on the first metal layer and hydrogenating the first insulation layer to form a hydrogenated insulation layer;

Step 12: applying a masking operation to form a first ditch in the first insulation layer;

Step 13: forming a second metal layer on the first insulation layer and applying a masking operation to form metal electrodes so as to complete a thin-film transistor and a photovoltaic cell;

Step 14: forming a second insulation layer on the second metal layer and applying a masking operation to the second insulation layer to form a second ditch;

Step 15: forming a planarization layer on the second insulation layer and applying a masking operation to form a third ditch;

Step 16: forming a transparent electrode on the planarization layer and applying a masking operation to the transparent electrode to form a predetermined pattern; and Step 17: carrying out an annealing operation on the transparent electrode;

wherein the substrate comprises a glass substrate;

wherein the buffer layer, the amorphous silicon layer, and the first and second insulation layers are formed on the substrate through chemical vapor deposition;

wherein the first and second metal layers are formed through sputtering operations;

wherein the masking operation comprises exposure operation, development operation, and etching operation;

wherein the $N^+$ ions, the $N^-$ ions, and the $P^+$ ions are located in the polysilicon layer;

wherein the transparent electrode layer comprises an indium tin oxide layer; and wherein the planarization layer comprises an organic layer.

The efficacy of the present invention is that the present invention provides a method for manufacturing an array substrate with embedded photovoltaic cell, which forms a photovoltaic cell at the same time when an array substrate is being formed, wherein a simple manufacture process is applied to embed the photovoltaic cell in the array substrate, so that light emitting from a backlight source can be used to supply electrical power to the components or accessories of a liquid crystal display panel. The photo energy emitting from the backlight source can be fully used and the consumption of external powers can be reduced.

For better understanding of the features and technical contents of the present invention, reference will be made to the following detailed description of the present invention and the attached drawings. However, the drawings are provided for the purposes of reference and illustration and are not intended to impose undue limitations to the present invention.

BRIEF DESCRIPTION OF THE DRAWINGS

The technical solution, as well as beneficial advantages, will be apparent from the following detailed description of an embodiment of the present invention, with reference to the attached drawings. In the drawings.

DETAILED DESCRIPTION OF THE PREFERRED EMBODIMENTS

To further expound the technical solution adopted in the present invention and the advantages thereof, a detailed description is given to a preferred embodiment of the present invention and the attached drawings.

Figure 1:
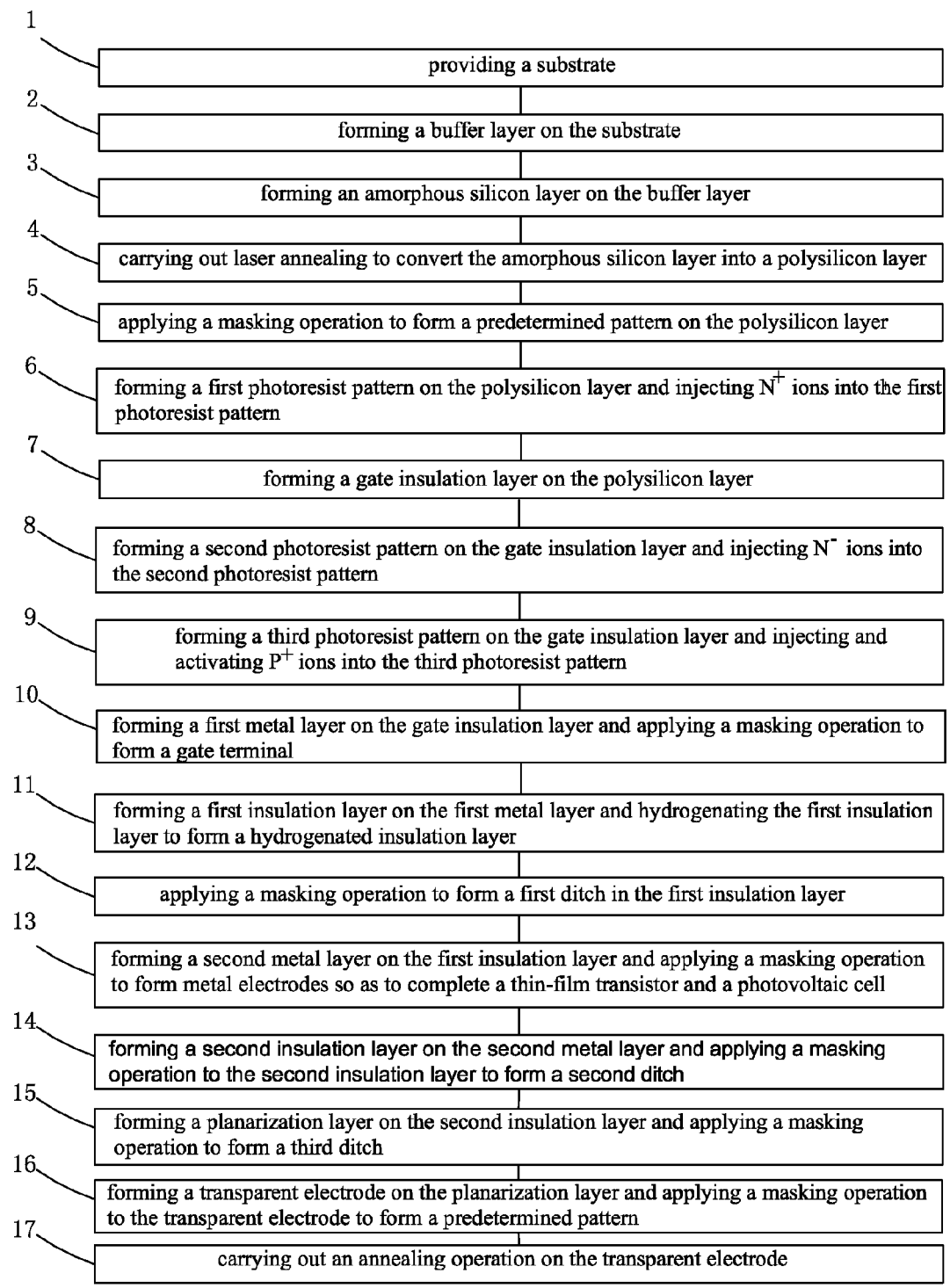
FIG. 1 is a flow chart illustrating a method for manufacturing an array substrate with embedded photovoltaic cell according to the present invention.
Figure 2:
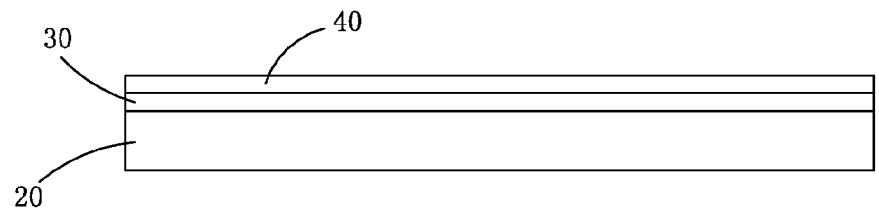
FIGS. 2-18 are schematic views showing varies steps of the method for manufacturing array substrate with embedded photovoltaic cell according to the present invention.
Figure 3:
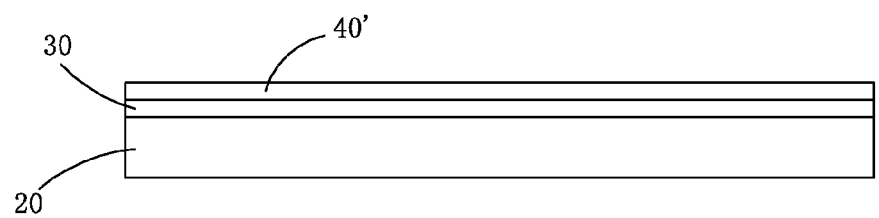
Figure 4:
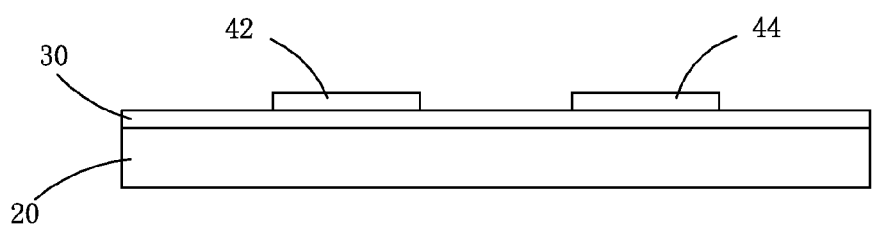
Figure 5:
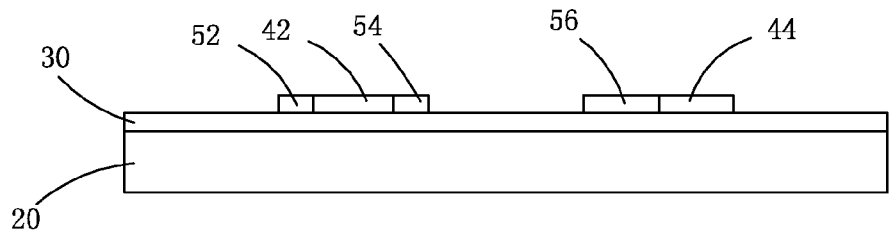
Figure 6:
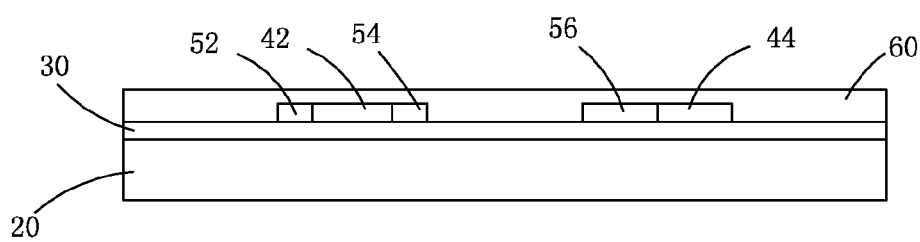
Figure 7:
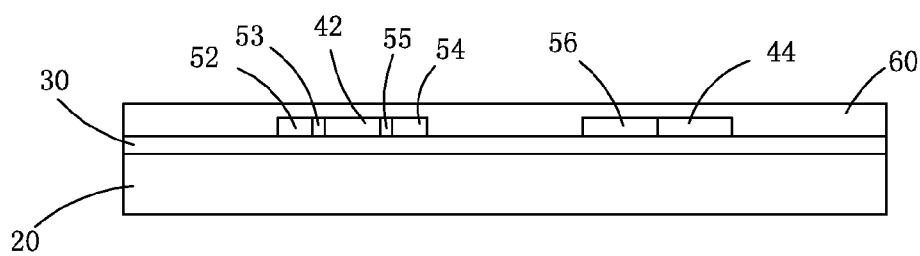
Figure 8:
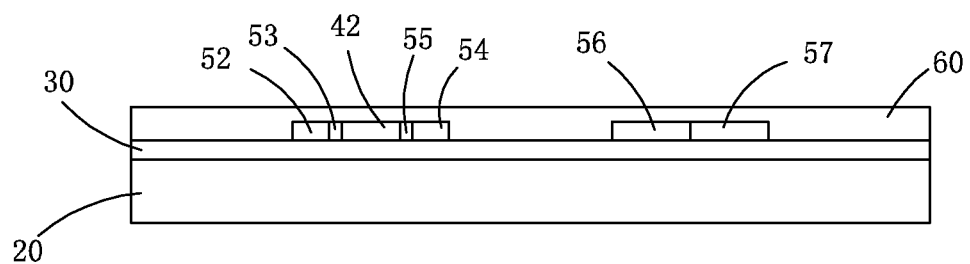
Figure 9:
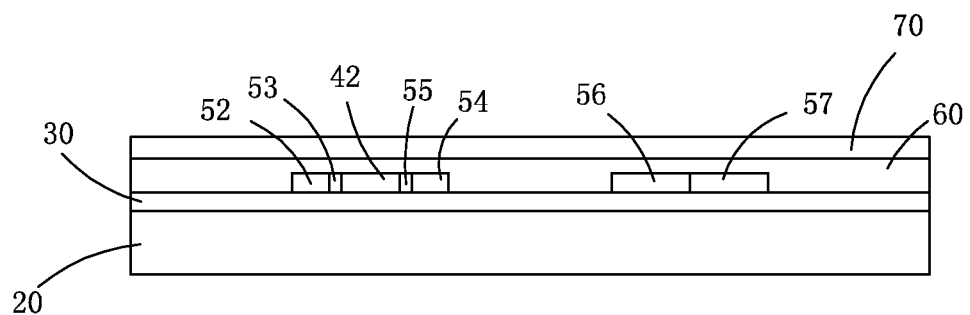
Figure 10:
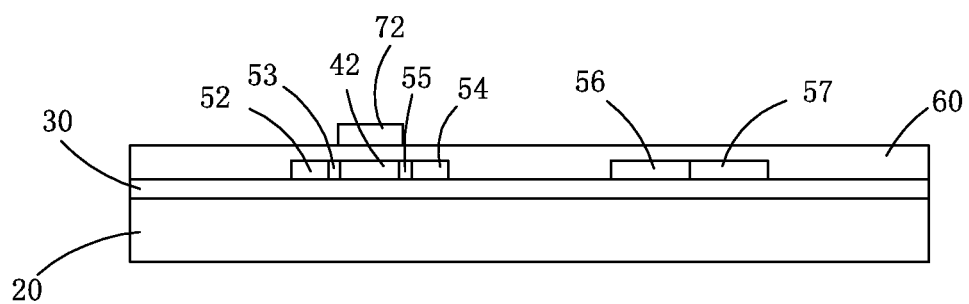
Figure 11:
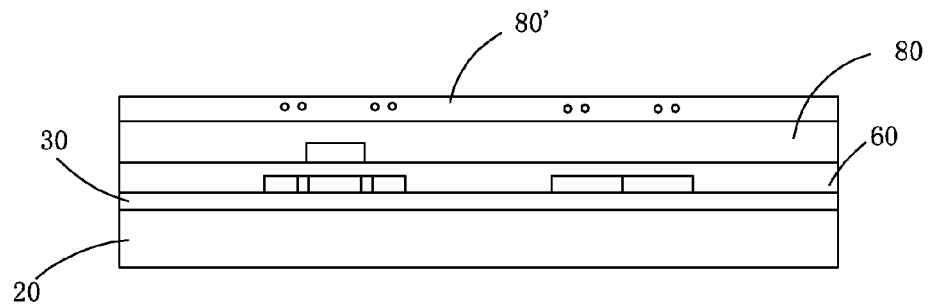
Figure 12:
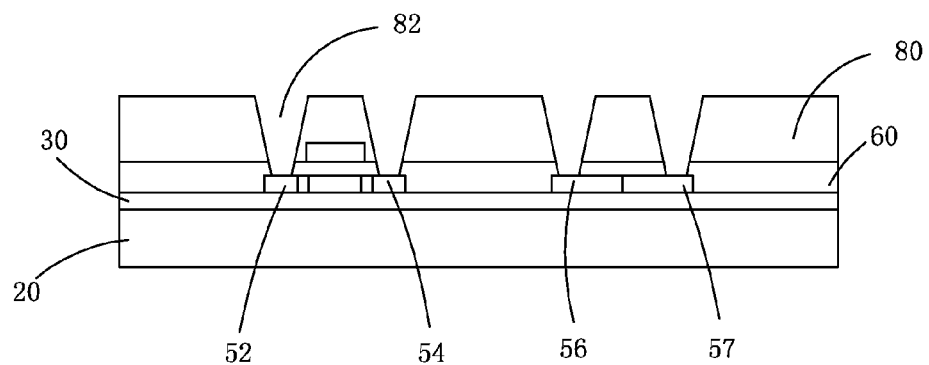
Figure 13:
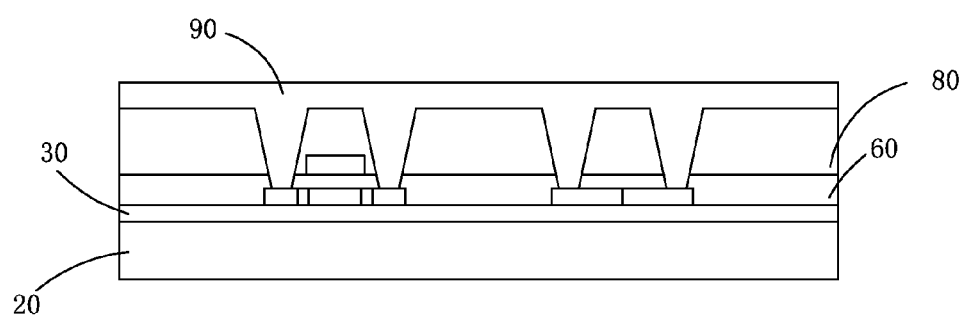
Figure 14:
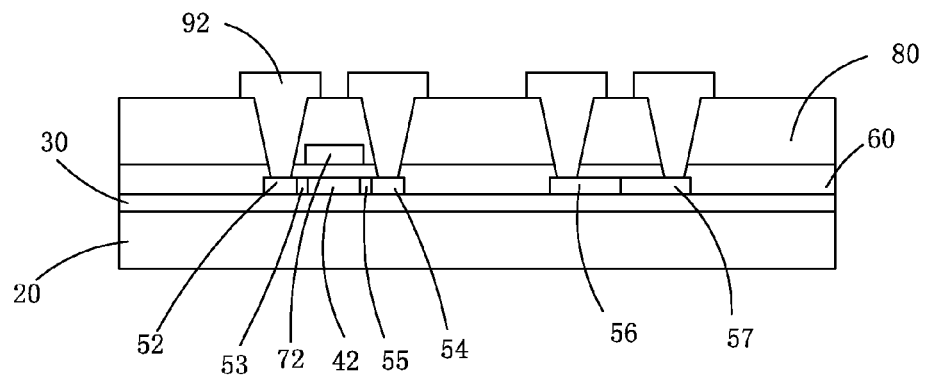
Figure 15:
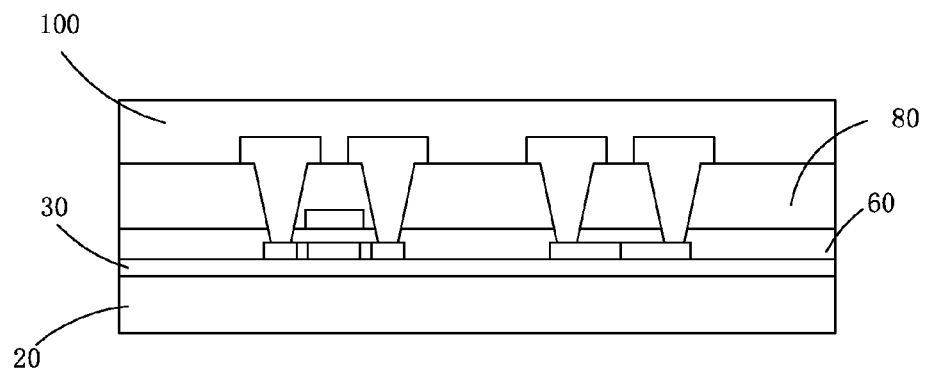
Figure 16:
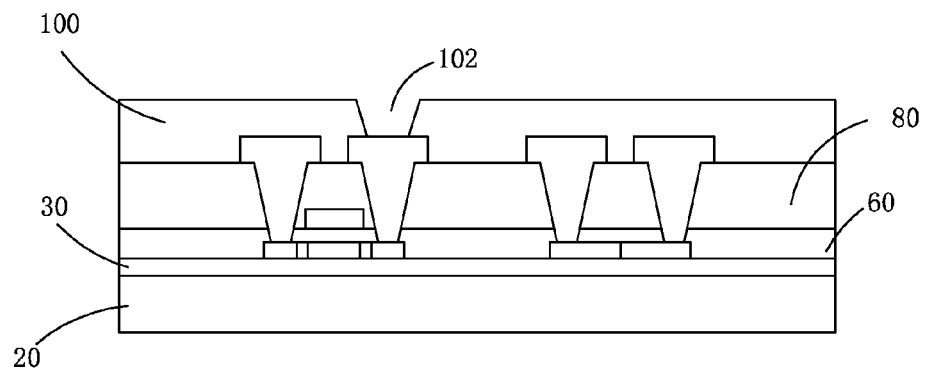
Figure 17:
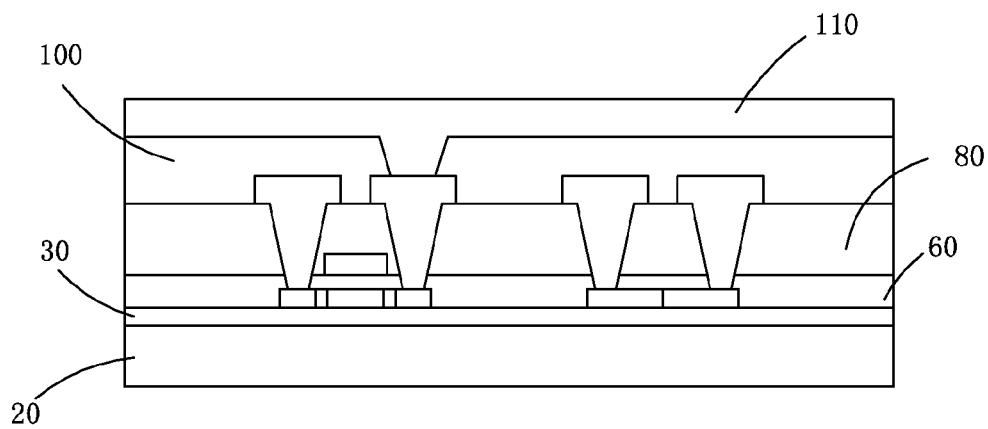
Figure 18:
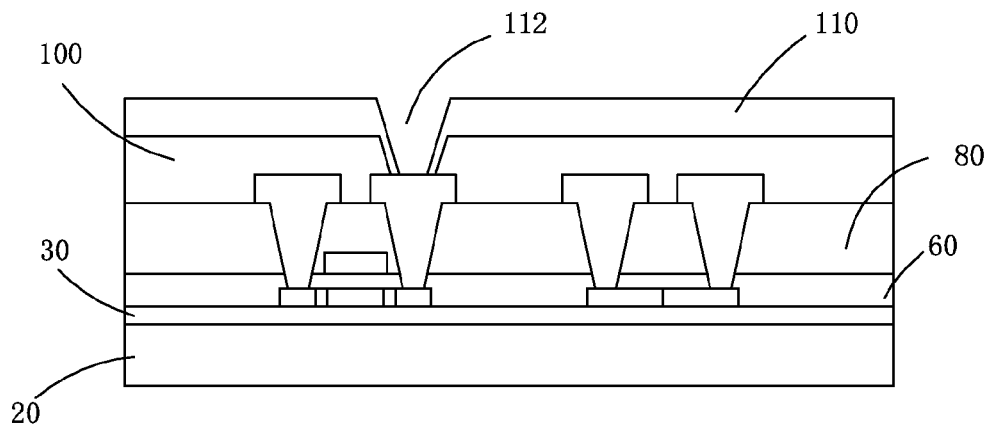
Figure 19:
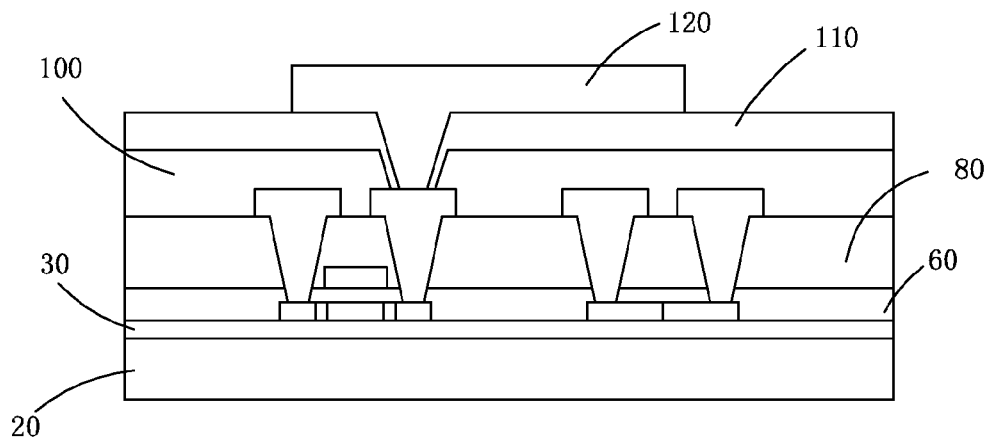
FIG. 19 is a schematic view showing the structure of an array substrate manufactured with the method for manufacturing an array substrate with embedded photovoltaic cell according to the present invention.

Referring to FIGS. 1-19, the present invention provides a method for manufacturing an array substrate with embedded photovoltaic cell, which comprises the following steps:

Step 1: providing a substrate 20. The substrate 2 is made of a light-transmitting material and is generally a glass substrate, a quartz substrate, or a substrate made of any other suitable materials.

Step 2: forming a buffer layer 30 on the substrate 20.

The buffer layer 30, which is also referred to as a block layer, is formed on the substrate 20 through chemical vapor deposition (CVD) to block diffusion of impurity toward an active layer.

Step 3: forming an amorphous silicon layer 40 on the buffer layer 30. The amorphous silicon layer 40 is formed on the buffer layer 30 through CVD.

Step 4: carrying out laser annealing to convert the amorphous silicon layer 40 into a polysilicon layer 40'.

Step 5: applying a masking operation to form a predetermined pattern on the polysilicon layer 40'.

The way to carry out the step is to coat a layer of a photosensitive material on the polysilicon layer 40'. This layer is the so-called photoresist layer. Afterwards, light is conducted through gray tone mask or half tone mask to irradiate the photoresist layer in order to expose the photoresist layer. The gray tone mask or half tone mask carries the pattern of an active zone and may thus allow a fraction of light to transmit through the gray tone mask or half tone mask to irradiate the photoresist layer, making the exposure of the photoresist layer effected in a selective manner and thus completely duplicating the pattern carried by the gray tone mask or the half tone mask on the photoresist layer. Then, a suitable developer is applied to remove a portion of the photoresist layer so as to display the desired pattern on the photoresist layer. Afterwards, etching is applied to remove a portion of the polysilicon layer 40'. The etching can be wet etching or dry etching or a combination of both. Finally, the remaining patterned photoresist layer is completely removed to form a first polysilicon section 42 and a second polysilicon section 44 having predetermined patterns. In the instant embodiment, the first polysilicon section 42 and the second polysilicon section 44 are arranged to separate from each other.

Step 6: forming a first photoresist pattern on the polysilicon layer 40' and injecting $N^+$ ions into the first photoresist pattern.

The way of carrying out this step is to coat a photo-sensitive material on the polysilicon layer 40' and applying a gray tone mask or a half tone mask to have the photoresist layer exposed and further applying a suitable developer to remove a portion of the photoresist layer so as to form the first photoresist pattern. Injection of $N^+$ ions is made on the first photoresist pattern and then the remaining patterned photoresist layer is removed so as to form first, second, and third $N^+$ ion sections 52, 54, 56 on the buffer layer 30. In the instant embodiment, the first and second $N^+$ ion sections 52, 54 are respectively located at opposite sides of the first polysilicon section 42 and the third $N^+$ ion sections 56 is located at the side of second polysilicon section 44 that is close to the first polysilicon section 42.

Step 7: forming a gate insulation layer 60 on the polysilicon layer 40'.

Step 8: forming a second photoresist pattern on the gate insulation layer 60 and injecting $N^-$ ions into the second photoresist pattern.

The way of carrying out this step is to coat a photo-sensitive material on the gate insulation layer 60 and applying a gray tone mask or a half tone mask to have the photoresist layer exposed and further applying a suitable developer to remove a portion of the photoresist layer so as to form the second photoresist pattern. Injection of $N^-$ ions is made on the second photoresist pattern and then the remaining patterned photoresist layer is removed so as to form first and second $N^-$ ion sections 53, 55 on the sides of the first and second $N^+$ ion sections 52, 54 that are close to the first polysilicon section 42.

Step 9: forming a third photoresist pattern on the gate insulation layer 60 and injecting and activating $P^+$ ions into the third photoresist pattern.

The way of carrying out this step is to coat a photo-sensitive material on the gate insulation layer 60 and applying a gray tone mask or a half tone mask to have the photoresist layer exposed and further applying a suitable developer to remove a portion of the photoresist layer so as to form the third photoresist pattern. Injection of $P^+$ ions is made on the third photoresist pattern and then the remaining patterned photoresist layer is removed so as to form a $P^+$ ion section 57 on the side of the third $N^+$ ion sections 56 that is distant from the first polysilicon section 42. And then the implanted ions are activated.

Step 10: forming a first metal layer 70 on the gate insulation layer 60 and applying a masking operation to form a gate terminal 72. The operation process is similar to what described above and repeated description is omitted here.

Step 11: forming a first insulation layer 80 on the first metal layer 70 and hydrogenating the first insulation layer 80 to form a hydrogenated insulation layer 80'.

Step 12: applying a masking operation to form a first ditch 82 in the first insulation layer 80 so as to expose the first, second, and third $N^+$ ion sections 52, 54, 56 and the $P^+$ ion section 57.

Step 13: forming a second metal layer 90 on the first insulation layer 80 and applying a masking operation to form metal electrodes 92 so as to complete a thin-film transistor (TFT) and a photovoltaic cell.

The first $N^+$ ion section 52, the second $N^+$ ion section 54, the first $N^-$ ion section 53, the second $N^-$ ion section 55, the first polysilicon section 42, the gate terminal 72, and two of the metal electrodes 92 collectively form the thin-film transistor. The third $N^+$ ion section 56, the $P^+$ ion section 57, and two of the metal electrodes 92 collectively form the photovoltaic cell.

Step 14: forming a second insulation layer 100 on the second metal layer 90 and applying a masking operation to the second insulation layer 100 to form a second ditch 102.

Step 15: forming a planarization layer 110 on the second insulation layer 100 and applying a masking operation to form a third ditch 112. In the instant embodiment, the planarization layer 110 is an organic layer.

Step 16: forming a transparent electrode 120 on the planarization layer 110 and applying a masking operation to the transparent electrode 120 to form a predetermined pattern. The transparent electrode 120 is an ITO (indium tin oxide) layer, which functions to drain electrical current from a drain terminal of the thin-film transistor.

Step 17: carrying out an annealing operation on the transparent electrode 120 to improve electrical property.

The buffer layer 30, the amorphous silicon layer 40, and the first and second insulation layers 80, 100 are all formed by deposition on the substrate through CVD. The first and second metal layers 70, 90 are formed through sputtering operations.

In summary, the present invention provides a method for manufacturing an array substrate with embedded photovoltaic cell, which forms a photovoltaic cell at the same time when an array substrate is being formed, wherein a simple manufacture process is applied to embed the photovoltaic cell in the array substrate, so that light emitting from a backlight source can be used to supply electrical power to the components or accessories of a liquid crystal display panel. The photo energy emitting from the backlight source can be fully used and the consumption of external powers can be reduced.

Based on the description given above, those having ordinary skills of the art may easily contemplate various changes and modifications of the technical solution and technical ideas of the present invention and all these changes and modifications are considered within the protection scope of right for the present invention.

What is claimed is:

1. A method for manufacturing array substrate with embedded photovoltaic cell, comprising the following steps:
    (1) providing a substrate;
    (2) forming a buffer layer on the substrate;
    (3) forming an amorphous silicon layer on the buffer layer;
    (4) carrying out laser annealing to convert the amorphous silicon layer into a polysilicon layer;
    (5) applying a masking operation to form a predetermined pattern, which includes a first polysilicon section and a second polysilicon section, on the polysilicon layer;

(6) forming a first photoresist pattern on the polysilicon layer and injecting N⁺ ions into the first photoresist pattern so as to form first, second, and third N⁺ ion sections where the first and second N⁺ ion sections are respectively located at opposite sides of the first polysilicon section and the third N⁺ ion section is located at the side of the second polysilicon section that is close to the first polysilicon section;

(7) forming a gate insulation layer on the polysilicon layer;

(8) forming a second photoresist pattern on the gate insulation layer and injecting N⁻ ions into the second photoresist pattern so as to form first and second N⁻ ion sections on the sides of the first and second N⁺ ion sections that are close to the first polysilicon section and not to form an N⁻ ion section between the second polysilicon section and the third N⁺ ion section;

(9) forming a third photoresist pattern on the gate insulation layer and injecting and activating P⁺ ions into the third photoresist pattern;

(10) forming a first metal layer on the gate insulation layer and applying a masking operation to form a gate terminal;

(11) forming a first insulation layer on the first metal layer and hydrogenating the first insulation layer to form a hydrogenated insulation layer;

(12) applying a masking operation to form a first ditch in the first insulation layer; and

(13) forming a second metal layer on the first insulation layer and applying a masking operation to form metal electrodes so as to complete a thin-film transistor with the first of silicon section the first and second N⁺ ion sections and the first and second N⁻ ion sections and to simultaneously complete a photovoltaic cell with the second polysilicon section and the third N⁺ ion section.

2. The method for manufacturing array substrate with embedded photovoltaic cell as claimed in claim 1 further comprising the following steps:

(14) forming a second insulation layer on the second metal layer and applying a masking operation to the second insulation layer to form a second ditch;

(15) forming a planarization layer on the second insulation layer and applying a masking operation to form a third ditch;

(16) forming a transparent electrode on the planarization layer and applying a masking operation to the transparent electrode to form a predetermined pattern; and

(17) carrying out an annealing operation on the transparent electrode.

3. The method for manufacturing array substrate with embedded photovoltaic cell as claimed in claim 1, wherein the substrate comprises a glass substrate.

4. The method for manufacturing array substrate with embedded photovoltaic cell as claimed in claim 2, wherein the buffer layer, the amorphous silicon layer, and the first and second insulation layers are formed on the substrate through chemical vapor deposition.

5. The method for manufacturing array substrate with embedded photovoltaic cell as claimed in claim 2, wherein the first and second metal layers are formed through sputtering operations.

6. The method for manufacturing array substrate with embedded photovoltaic cell as claimed in claim 1, wherein the masking operation comprises exposure operation, development operation, and etching operation.

7. The method for manufacturing array substrate with embedded photovoltaic cell as claimed in claim 1, wherein the N⁺ ions, the N⁻ ions, and the P⁺ ions are located in the polysilicon layer.

8. The method for manufacturing array substrate with embedded photovoltaic cell as claimed in claim 2, wherein the transparent electrode layer comprises an indium tin oxide layer.

9. The method for manufacturing array substrate with embedded photovoltaic cell as claimed in claim 2, wherein the planarization layer comprises an organic layer.

10. A method for manufacturing array substrate with embedded photovoltaic cell, comprising the following steps:

(1) providing a substrate;

(2) forming a buffer layer on the substrate;

(3) forming an amorphous silicon layer on the buffer layer;

(4) carrying out laser annealing to convert the amorphous silicon layer into a polysilicon layer;

(5) applying a masking operation to form a predetermined pattern, which includes a first polysilicon section and a second polysilicon section, on the polysilicon layer;

(6) forming a first photoresist pattern on the polysilicon layer and injecting N⁺ ions into the first photoresist pattern so as to form first, second, and third N⁺ ion sections where the first and second N⁺ ion sections are respectively located at opposite sides of the first polysilicon section and the third N⁺ ion section is located at the side of the second polysilicon section that is close to the first polysilicon section;

(7) forming a gate insulation layer on the polysilicon layer;

(8) forming a second photoresist pattern on the gate insulation layer and injecting N⁻ ions into the second photoresist pattern so as to form first and second N⁻ ion sections on the sides of the first and second N⁺ ion sections that are close to the first polysilicon section and not to form an N⁻ ion section between the second polysilicon section and the third N⁺ ion section;

(9) forming a third photoresist pattern on the gate insulation layer and injecting and activating P⁺ ions into the third photoresist pattern;

(10) forming a first metal layer on the gate insulation layer and applying a masking operation to form a gate terminal;

(11) forming a first insulation layer on the first metal layer and hydrogenating the first insulation layer to form a hydrogenated insulation layer;

(12) applying a masking operation to form a first ditch in the first insulation layer;

(13) forming a second metal layer on the first insulation layer and applying a masking operation to form metal electrodes so as to complete a thin-film transistor with the first of silicon section the first and second N⁺ ion sections and the first and second N⁻ ion sections and to simultaneously complete a photovoltaic cell with the second polysilicon section and the third N⁺ ion section;

(14) forming a second insulation layer on the second metal layer and applying a masking operation to the second insulation layer to form a second ditch;

(15) forming a planarization layer on the second insulation layer and applying a masking operation to form a third ditch;

(16) forming a transparent electrode on the planarization layer and applying a masking operation to the transparent electrode to form a predetermined pattern; and

(17) carrying out an annealing operation on the transparent electrode wherein the substrate comprises a glass substrate;

wherein the buffer layer, the amorphous silicon layer, and the first and second insulation layers are formed on the substrate through chemical vapor deposition;
wherein the first and second metal layers are formed through sputtering operations;
wherein the masking operation comprises exposure operation, development operation, and etching operation;
wherein the $N^+$ ions, the $N^-$ ions, and the $P^+$ ions are located in the polysilicon layer;
wherein the transparent electrode layer comprises an indium tin oxide layer; and
wherein the planarization layer comprises an organic layer.

* * * * *